United States Patent [19]

Angelopoulos et al.

[11] Patent Number: 5,464,927

[45] Date of Patent: Nov. 7, 1995

[54] POLYAMIC ACID AND POLYIMIDE FROM FLUORINATED REACTANT

[75] Inventors: Marie Angelopoulos, Briarcliff Manor, N.Y.; Jeffrey D. Gelorme, Plainvill, Conn.; Jeffrey W. Labadie, Sunnyvale, Calif.; David A. Lewis, Carmel, N.Y.; Sally A. Swanson, San Jose, Calif.; Nancy C. Labianca, Yalesville, Conn.

[73] Assignee: International Business Machines Corporation, Armonk, N.Y.

[21] Appl. No.: 58,303

[22] Filed: May 10, 1993

Related U.S. Application Data

[63] Continuation of Ser. No. 782,923, Oct. 25, 1991, abandoned.

[51] Int. Cl.⁶ .................... C08G 73/10; C08G 69/26
[52] U.S. Cl. .................... 528/350; 528/125; 528/128; 528/170; 528/172; 528/173; 528/174; 528/176; 528/183; 528/185; 528/188; 528/220; 528/229; 528/353; 524/600; 525/432; 525/436
[58] Field of Search .................... 528/353, 350, 528/125, 128, 170, 172, 173, 174, 176, 183, 185, 188, 220, 229; 524/600

[56] References Cited

U.S. PATENT DOCUMENTS

| | | | |
|---|---|---|---|
| 3,179,631 | 4/1965 | Endrey | 528/353 |
| 3,179,632 | 4/1965 | Hendrix | 528/353 |
| 3,179,633 | 4/1965 | Endrey | 528/353 |
| 3,356,648 | 12/1967 | Rogers | 528/353 |
| 3,423,491 | 1/1969 | McLain et al. | 264/49 |
| 3,723,306 | 3/1973 | Bridgeford | 210/22 |
| 3,741,942 | 6/1973 | Crivello | 528/353 |
| 3,957,651 | 5/1976 | Kesting | 210/490 |
| 3,959,350 | 5/1976 | Rogers | 528/353 |
| 4,384,107 | 5/1983 | Rogers | 528/183 |
| 4,393,194 | 7/1983 | Guadiana | 528/348 |
| 4,507,467 | 3/1985 | Shimada | 528/348 |
| 4,542,257 | 9/1985 | Fraser et al. | 136/251 |
| 4,592,925 | 6/1986 | Du Pont et al. | 427/74 |
| 4,595,584 | 6/1986 | Wu et al. | 424/19 |
| 4,603,061 | 7/1986 | St. Clair et al. | 427/162 |
| 4,629,685 | 12/1986 | Pfeifer | 430/583 |
| 4,629,777 | 12/1986 | Pfeifer | 528/353 |
| 4,681,950 | 7/1987 | Fischer et al. | 335/14 |
| 4,864,016 | 9/1989 | DuPont | 528/353 |
| 4,876,329 | 10/1989 | Chiang et al. | 528/353 |
| 4,912,197 | 3/1990 | Hayes | 528/353 |
| 4,952,669 | 8/1990 | Vora | 528/353 |
| 4,954,609 | 9/1990 | Vora | 528/353 |
| 5,021,540 | 6/1991 | Leone-Bay et al. | 528/183 |
| 5,025,089 | 6/1991 | Vora et al. | 528/353 |
| 5,026,822 | 6/1991 | Vora et al. | 528/353 |
| 5,049,649 | 9/1991 | Rohitkumar | 528/353 |
| 5,055,116 | 10/1991 | Kohn et al. | 55/16 |
| 5,061,784 | 10/1991 | Mueller et al. | 528/353 |
| 5,071,997 | 12/1991 | Harris | 528/350 |
| 5,109,107 | 4/1992 | Vora et al. | 528/350 |
| 5,218,083 | 6/1993 | Gerber et al. | 528/350 |
| 5,233,018 | 8/1993 | Ando et al. | 528/350 |
| 5,270,438 | 12/1993 | Yusa et al. | 528/350 |
| 5,286,841 | 2/1994 | Auman et al. | 528/350 |
| 5,338,826 | 8/1994 | St. Clair et al. | 528/350 |

FOREIGN PATENT DOCUMENTS

| | | |
|---|---|---|
| 0354361A1 | 2/1990 | European Pat. Off. . |
| 0354360A1 | 2/1990 | European Pat. Off. . |
| 0361413A1 | 4/1990 | European Pat. Off. . |

*Primary Examiner*—P. Hampton-Hightower
*Attorney, Agent, or Firm*—Pollock, Vande Sande & Priddy

[57] ABSTRACT

Copolyamic acid is obtained from tetracarboxylic acid dianhydride, diamine and a fluorinated diamine and/or fluorinated tetracarboxylic acid dianhydride; and optionally ester or amine salt derivative thereof to obtain radiation sensitive polymer; and low optical high thermally stable polyimide from curing the above polyamic acid and/or derivative thereof.

22 Claims, 1 Drawing Sheet

POLYAMIC ACID AND POLYIMIDE FROM FLUORINATED REACTANT

This is a Continuation of Ser. No. 07/782,923, filed on Oct. 25, 1991, and now abandoned.

TECHNICAL FIELD

The present invention is concerned with new copolyamic acids and polyamic derivatives (e.g.—esters, and amine salts) and polyimides derived from curing the copolyamic acids or derivatives thereof. In particular, the present invention is concerned with polyimides that are especially useful as radiation sensitive polymers. The present invention makes possible the formation of polyimides that exhibit high glass transition temperature, low thermal expansion from a photocrosslinkable poly(amic acid) derivative which also displays low ultraviolet light absorption.

BACKGROUND ART

Polyimides are currently used to a large extent in microcircuit fabrication as carrier layers and insulating layers in electronic packaging of semiconductor chips and microcircuitry. When the polyimides are provided on a substrate, such are normally applied as precursors in the polyamic acid form that contains free carboxylic acid groups. For the most part, the fabrication of photopatterned polyimide layers is carried out using non-photoreactive polyimide precursors with the aid of conventional photoresist materials.

In addition, in order to be able to significantly reduce the number of processing steps, there have been some suggestions to directly photopattern photocrosslinkable polyimide precursors. For instance, see U.S. Pat. Nos. 4,670,535 and 4,778,859.

Of particular importance in the electronics industry are polyimides based upon 3,3',4,4'-biphenyl tetracarboxylic acid dianhydride (BPDA) and p-phenylene diamine (PDA). Such polyimides possess several important properties for such purposes including low solvent uptake, low thermal expansion coefficient (TCE) and high glass transition temperature (Tg). However, developing a photosensitive polyimide system based on a BPDA and PDA backbone is made difficult because of high absorption of the backbone in much of the ultraviolet light region. This high absorption limits the efficiency of any photochemistry occurring at 313, 334, 365, 405 and 436 nanometers mercury lines because of competitive absorption between the backbone and any initiators required for the photochemistry.

Although polyimides have been obtained from 2,2-bis(3,4-dicarboxyphenyl) hexafluoropropane dianhydride and 2,2-bis[4-aminophenyl] hexafluoropropane, these polymers do not possess the types of physical properties needed for use in the electronics industry such as a high glass transition temperature (>350° C.), a low thermal expansion coefficient and high solvent resistance. These polyimides and their related polyimide precursors; however, have much lower absorption in the UV region as compared to polyimides based on BPDA/PDA.

SUMMARY OF INVENTION

The present invention, makes it possible to significantly reduce the UV absorption characteristics of polyimides and radiation crosslinkable polyimide precursors without incurring a concomitant loss to any significant extent of physical properties of the polyimide such as the glass transition temperature and the coefficient of thermal expansion.

The polyimides obtainable by the present invention also exhibit good solvent resistance (e.g.—resistance to swelling and cracking).

In addition, the present invention provides polyimide precursor compositions that exhibit increased solubility and increased flexibility as compared to the rigid BPDA/PDA prior art systems, which in turn, leads to faster development time and high resolution patterns.

In particular, the present invention is concerned with a copolyamic acid or ester thereof or amine salt thereof from:

a) tetracarboxylic acid dianhydride, b) organic diamine having the formula:

$$H_2N \ R^1 \ NH_2$$

wherein $R^1$ is a polycyclic aromatic organic diradical in which the aromatic rings may be aromatic, heterocyclic, or directly attached rings; and c) a co-reactant selected from the group consisting of:
  1) fluorinated diamine having a formula selected from the group consisting of:

i) 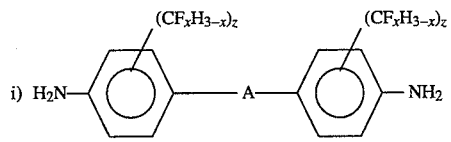

wherein A is $$C(CF_xH_{3-x}) \ (R^2)$$

$R^2$ is alkyl or aryl or $CF_xH_{3-x}$;

x is a whole number integer from 1–3 z is a whole number integer from 0–4; and ii) 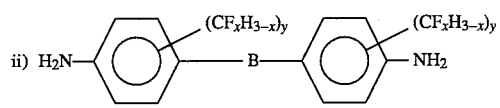

wherein B is a direct bond or $$C(CH_3)_2; \text{ and}$$

y is a whole number integer from 1–4; and 2) fluorinated tetracarboxylic acid dianhydride having the formula

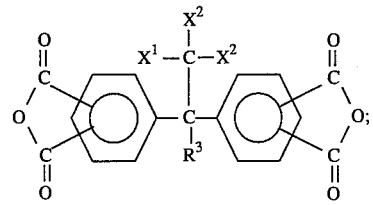

$X^1$ is fluorine and each $X_2$ individually is selected from the group consisting of hydrogen, fluorine and chlorine, $R^3$ is alkyl, aryl or $C(X^2)_3$; and 3) mixtures of 1) and 2); and
    when said co-reactant includes said fluorinated diamine, the molar ratio of said organic amine to said fluorinated diamine is about 9.5:0.5 to about 1:1; and when said co-reactant includes said fluorinated tetracarboxylic acid dianhydride, the molar ratio of said tetracarboxylic acid dianhydride to said fluorinated tetracarboxylic acid dianhydride is about 9.5:0.5 to about 1:1.

In addition, the present invention is concerned with copolyamic acid derivatives such as esters containing monoethylenically unsaturated groups or containing monoacetylenically unsaturated groups, and/or monoethylenically unsaturated or monoacetylenically unsaturated amine salts of the above described copolyamic acids.

A further aspect of the present invention, is a copolyimide obtained from curing the above copolyamic acids and/or derivatives thereof.

The present invention is also concerned with radiation sensitive compositions that contain the above copolyamic acids or derivatives thereof. The radiation sensitive compositions will typically also contain an initiator and sensitizer.

A still further aspect of the present invention is concerned with using the above-defined radiation sensitive compositions to fabricate a pattern. The process comprises providing a layer of the radiation sensitive composition and then imagewise exposing selected portions of the layer to actinic radiation to cause crosslinking of the exposed portions. The unexposed portions of the layer are removed to thereby provide the pattern, followed by thermal cure for conversion to the patterned polymide.

BRIEF DESCRIPTION OF DRAWINGS

The FIGS. 1 and 2 are a SEM illustrating use of the present invention for lithography.

BEST AND VARIOUS MODES FOR CARRYING OUT INVENTION

Figure 1:
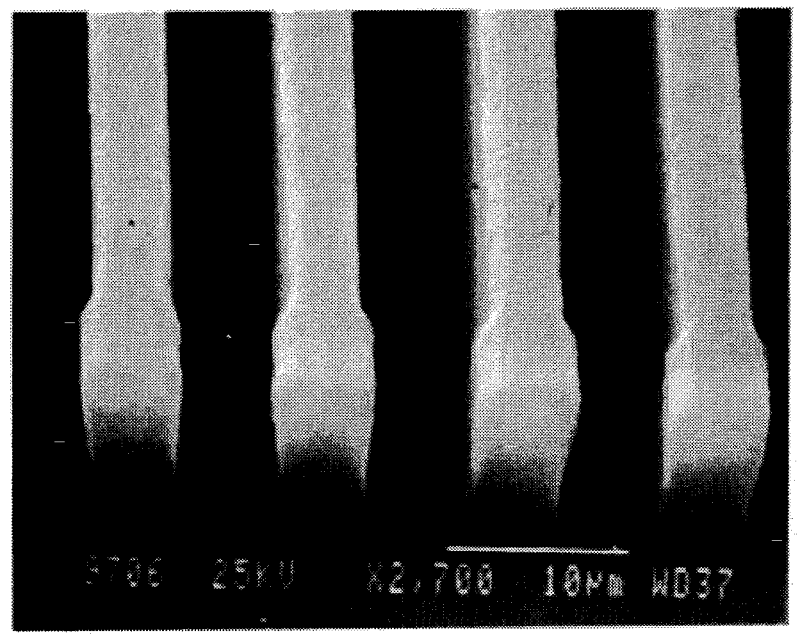
Figure 2:
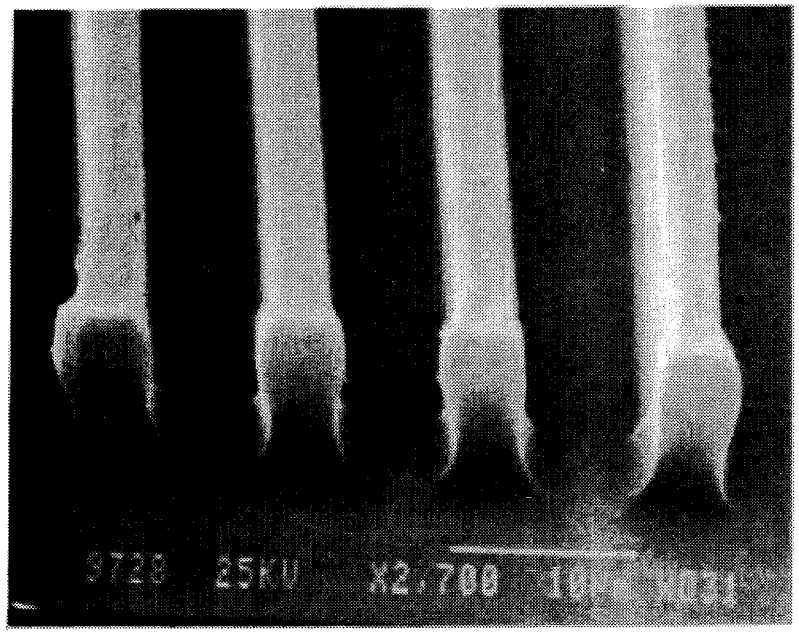

The copolyamic acids or derivatives thereof (polyimide precursors) of the present invention are from a tetracarboxylic acid dianhydride, diamine and fluorinated diamine and/or fluorinated tetracarboxylic acid dianhydride. The polyimide precursors of the present invention exhibit good physical properties, while at the same time, possessing relatively low UV absorption characteristics. In addition, the polyimide precursors of the present invention possess improved solubility and flexibility which leads to faster development time and high resolution as compared to a rigid BPDA/PDA system.

Polyimides obtained from curing the polyimide precursors can be thermoplastic displaying a Tg, or be absent of a Tg to the decomposition point depending on the composition.

Examples of tetracarboxylic acid dianhydrides are characterized by the following formula:

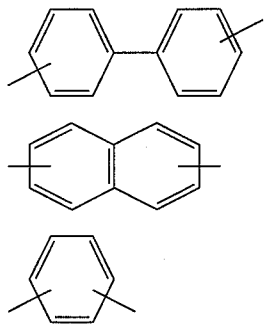

wherein R is a tetravalent organic radical selected from the group consisting of aromatic, aromatic heterocyclic, and substituted groups thereof. However, the more typical dianhydrides are those in which the R groups have at least 6 carbon atoms characterized by benzenoid unsaturation, i.e., resonating double bonds in an aromatic ring structure, wherein the 4 carbonyl groups of the dianhydride are each attached to separate carbon atoms and wherein the carbon atoms of each pair of carbonyl groups are directly attached to adjacent carbon atoms in a 6-membered benzenoid ring of the R group to provide a 5-membered ring as follows:

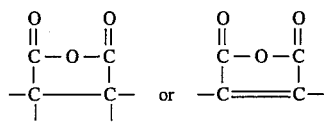

Illustrations of dianhydrides suitable for use in the present invention include: pyromellitic dianhydride; 2,3,6,7-naphthalene tetracarboxylic dianhydride; 3,3',4,4'-biphenyltetracarboxylic acid dianhydride; 1,2,5,6-naphthalene tetracarboxylic dianhydride; 2,2',3,3'-biphenyl tetracarboxylic dianhydride; bis (3,4-dicarboxyphenyl) sulfone dianhydride; 3,4,3',4'-benzophenone tetracarboxylic dianhydride; terphenyl dianhydride; and mixtures thereof.

The preferred tetracarboxylic acid dianhydride is 3,3',4,4' biphenyl tetracarboxylic acid dianhydride (BPDA).

Examples of organic diamines are characterized by the formula:

$$H_2N\ R^1\ NH_2$$

wherein $R^1$ is a monocyclic or polycyclic aromatic organic diradical in which the aromatic rings may be aromatic, heterocyclic, or directly attached rings, e.g., biphenylene and naphthalene.

The more typical $R^1$ groups in the diamines are those containing one or more rings, having 6 carbon atoms characterized by benzenoid unsaturation in each ring. Such $R^1$ groups include

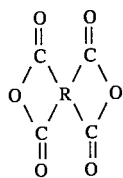

Specific examples of some diamines are:
p-phenylene diamine;
4,4'-diamino-diphenylamine; benzidine;
4,4'-diamino-diphenyl ether;
1,5-diamino-naphthalene;
3,3'-dimethyl-4,4'-diamino-biphenyl;
3,3'-dimethoxy benzidine;
1,4-bis(p-aminophenoxy) benzene;
1,3-bis(p-aminophenoxy) benzene;

The preferred diamine employed pursuant to the present invention is p-phenylene diamine.

The dianhydride and diamine are selected such that when used together without the modifications of the present invention would provide a relatively rigid polyimide having a Tg of at least about 320° C. and preferably at least about 350° C. The dianhydride and diamines employed are free from bridged or linked radicals as R and $R^1$ in the above formulae for the dianhydrides and diamines, respectively. The presence of such bridged or linked radicals would give the polyimide an undesired degree of flexibility.

The fluorinated diamines that can be employed in the present invention are represented by the following formula:

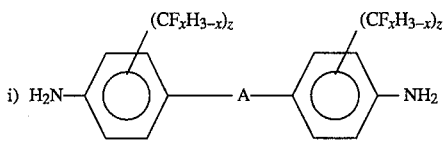

wherein A is

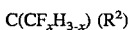

$R^2$ is alkyl or aryl or $CF_xH_{3-x}$;
x is a whole number integer from 1–3
z is a whole number integer from 0–4; and

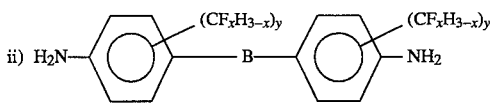

wherein B is a direct bond or

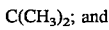

y is a whole number integer from 1–4.

Preferred A groups are $C(CF_3)_2$ and $C(CF_3)$(phenyl).

The preferred fluorinated diamine is 2,2- Bis [4-aminophenyl] hexafluoropropane.

In order to achieve the results obtained by the present invention when a fluorinated diamine is used, it is essential that the molar ratio of the organic diamine to the fluorinated diamine be about 9.5:0.5 to about 1:1, preferably about 9.5:0.5 to about 7:3, and most preferably about 9:1 to about 8:2.

In addition, the copolyamic acids and derivatives thereof of the present invention can include fluorinated dianhydrides preferably 2,2 bis (3,4-dicarboxyphenyl) hexafluoropropane dianhydride in place of or in addition to the fluorinated diamine.

Fluorinated tetracarboxylic acid dianhydrides are represented by the formula:

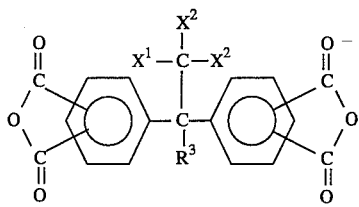

wherein $X^1$ is fluorine and each $X^2$ is individually selected from the group consisting of hydrogen, fluorine, and chlorine, and preferably fluorine $R^3$ is alkyl, aryl or $C(X^2)_3$.

Preferred linkage groups are $C(CF_3)_2$ and $C(CF_3)$(phenyl).

Examples of alkyl groups for $R^2$ and $R^3$ in the above formulae for the diamine and dianhydride, respectively, include $C_1$-$C_6$ groups such as methyl, ethyl and propyl. An example of an aryl group for $R^2$ and $R^3$ in the above formulae for the diamine and dianhydride, respectively, is phenyl.

When a fluorinated dianhydride is employed such is typically present in an amount such that the molar ratio of the tetracarboxylic acid dianhydride to said fluorinated dianhydride is about 9.5:0.5 to about 1:1, preferably about 9.5:0.5 to about 7:3 and most preferably about 9:1 to about 8:2.

The copolyamic acids can be prepared by those techniques used to prepare prior art polyimide precursors such as solution polymerization, typically using about equimolar amounts of the diamine component and the dianhydride component. The dianhydride can be added first to the solvent followed by the addition of a heated solution of the diamines to the dianhydrides. Normally, the temperature of such solution is about 25° C. to about 50° C. Alternatively, powdered dianhydride can be added to a solution of the diamines at a temperature of about 0° to about 10° C.

The reaction is typically carried out under an inert gas atmosphere such as nitrogen. The solvents useful in the solution polymerization are the organic solvents whose functional groups do not react with either of the reactants (the diamines or the dianhydrides) to any appreciable extent. Besides being inert to the system and preferably, being a solvent for the polyamide-acid, the organic solvent must be a solvent for at least one of the reactants, preferably for both of the reactants. To state it another way, the organic solvent is an organic liquid other than either reactant or homologs of the reactants that is a solvent for at least one reactant, and contains functional groups, the functional groups being groups of other than mono-functional primary and secondary amino groups, hydroxyl or thiol groups, and other than the monofunctional dicarboxylanhydro groups.

Suitable solvents include N,N-dialkyl carboxylamides such as N,N-dimethyl-formamide, N,N-dimethyl-acetamide, N,N-diethylformamide, N,N-diethylacetamide, N,N-dimethylmethoxyacetamide, N-methyl caprolactam; dimethylsulfoxide, N-methyl-2-pyrrolidinone, tetramethyl urea, pyridine, dimethylsulfone, hexamethylphosphoramide, tetramethylene sulfone, formamide, N-methylformamide, butyrolactone. The solvents can be used alone, in combinations of solvents, or in combination with poorer solvents such as benzene, ethyl acetate, tetrahydrofuran, diglyme, benzonitrile, dioxane, xylene, toluene and cyclohexane. The preferred solvent is N-methyl-2-pyrrolidinone.

The polymerization is usually carried out for a period of time sufficient that the molecular weight of the polymer is such that the inherent viscosity of the polymer is at least 0.25 dl/g and preferably about 0.35 to about 0.6 dl/g. The inherent viscosity is measured at 35° C. at a concentration of 0.5% by-weight of its polymer in N-methyl pyrrolidinone.

When the polyimide precursors are to be used in radiation sensitive compositions, a polyimide precursor with a monoethylenically or monoacetylenically unsaturated group can be prepared directly from the poly(amic acid) by quaternization with an amine containing a vinyl group or monoacetylenically unsaturated group, respectively, such as dimethylaminomethylmethacrylate, and aminostyrene. Alternatively a poly(amic ester) with a suitable monoethylenically or monoacetylenically unsaturated group can be prepared by reaction of typically about 2 moles of a substituted monoethylenically or monoacetylenically unsaturated compound containing an alcohol functionality with the dianhydride forming a half ester/acid monomer, followed by conversion to the diacyl chloride or imidazolide, followed by polymerization with a diamine. Examples of alcohols are hydroxyethylmethacrylate, hydroxypropylmethacrylate, hydroxyethylacrylate, and N-(hydroxymethyl) acrylamide, and propargyl alcohol.

The reaction of the polyamic acid with an appropriate monoethylenically or monoacetylenically unsaturated amine is typically carried out by reacting the polyamic acid directly with the amine at room temperature for about 12 to about 24 hours. Suitable amines are 3 allylamines, propargyl amines, and aromatic amines such as dimethylaminomethylmethacrylate, and aminostyrene.

In the case of the polyamic ester, the dianhydride is reacted with a hydroxy terminated ester of a monoethylenically or monoacetylenically unsaturated carboxylic acid such as 2-hydroxyethylmethacrylate, to convert each anhydride unit to an ester acid unit.

The resulting bis (ester acid) is converted into a reactive monomer by conversion of the acid groups into a reactive carboxyl species such as acid chlorides or imidazolides, that are polymerized with the diamine. When employed the unsaturated esters are present in amount of 50 to 100%, preferably about 75–100%, the balance made up with unreactive esters, such as methyl or ethyl.

The copolyamic acids of the present invention can be cured to polyimides by heating to temperatures of about 170° C. to about 400° C. and preferably about 250° C. to about 400° C.

In addition, the monoethylenically substituted ester and salt derivatives of the copolyamic acids can be crosslinked by subjecting such to actinic light such as visible light, ultraviolet light, e-beams, ion beams or x-rays.

When the compositions of the present invention are to be used in radiation sensitive composition, the compositions typically include radiation sensitive initiator and sensitizer. However, when e-beam or x-ray is the radiation source, the initiator and sensitizer may not be necessary.

The preferred initiators are:

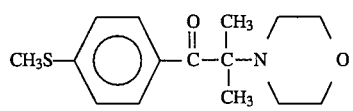

Irgacure 907 and

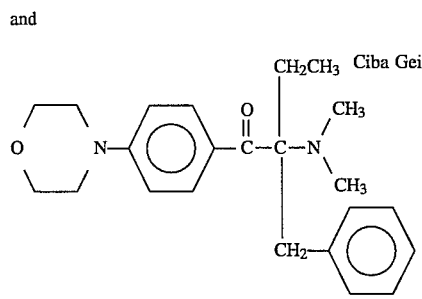

Ciba Geigy CG 25-369 and

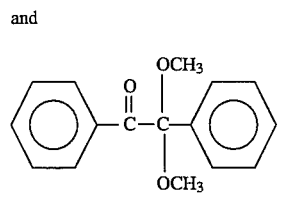

Irgacure 651

Other initiators include:
bis(dialkylamino) benzophenones, e.g., Michler's ketone and 4,4'-bis(diethylamino)benzophenone; other ketones, e.g. 2,5-bis(4'diethylaminobenzal)cyclohexanone, 2,6-bis(4'-dimethylaminobenzal-4-methylcyclohexanone, 2,6-bis(4'-diethylaminobenzal)-4-methylcyclohexanone, 4,4'-bis-(dimethylamino)chalcone, 4,4'-bis(diethylamino)chalcone, p-dimethylaminocinnamylideneindanone, p-dimethylaminobenzylideneindanone, 2-(p-dimethylaminophenylvinylene)benzothiazole, 2-(p-dimethylaminophenylvinylene) isonaphthothiazole, 1,3-bis(4'-dimethylaminobenzal)acetone, 1,3-bis-carbonylbis(7-diethylaminocoumarin); ethanolamine derivatives represented by the following formula S(A); and mercapto-containing aromatic heterocyclic compounds.

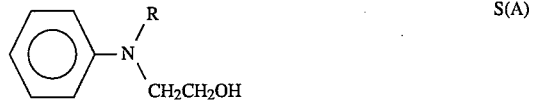

In this formula, R is hydrogen, an aliphatic residue which may have hydroxyl, or an aromatic residue.

The ethanolamine derivates include, for example, N-phenyldiethanolamine, N-phenylethanolamine, and N-phenyl-N'-ethylethanolamine. The mercapto-containing aromatic heterocyclic compounds include, for example, 2-mercaptobenzimdazol, 2-mercaptobenzothiazole, and 1-phenyl-5-mercapto-1H-tetrazole.

Examples of suitable sensitizers are the thioxanthone derivatives such as those represented by the formula:

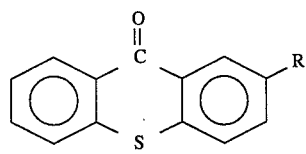

wherein R is isopropyl or propoxy and those represented by the formula:

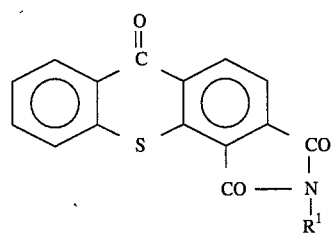

wherein $R^1$ is —C(CH$_3$)$_2$CH$_2$C(CH$_3$)$_3$

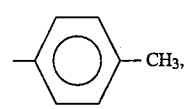

—CH$_2$CH$_2$OH, —CH$_2$CH$_2$N(CH$_3$)$_2$, —N(CH$_3$)$_2$, —CH$_2$CH$_2$SO$_3$⁻Na⁺, —CH$_2$CH$_2$CH$_2$N(CH$_3$)$_2$, —CH$_2$CH$_2$N(C$_2$H$_5$)$_2$, —CHCH=CH$_2$, —CH$_2$—C≡CH, and —CH(CH$_3$)$_2$.

The initiator is usually present in the composition in amounts of about 1% to about 5%, and preferably about 2.5% to about 3% by weight based upon the polyimide precursor.

The sensitizer is usually present in the composition in amounts of about 1% to about 5% and preferably about 2.5% to about 3% based upon the polyimide precursor.

In addition, radiation sensitive compositions will normally be applied as a solution of polyimide precursor and may but not necessarily include one or more reactive diluents.

Suitable reactive diluents include polyethylenically unsaturated compounds that are capable of reacting upon exposure to radiation such as ultraviolet light, and usually those that contain terminal ethylenic groups. Such compounds include unsaturated esters of polyols and especially esters of the methylene carboxylic acid such as ethylene diacrylate; diethylene glycol diacrylate; glycerol diacrylate; glycerol triacrylate; ethylene dimethacrylate; 1,3-propylene dimethacrylate; 1,2,4-butane triol trimethacrylate; 1,4-benzenediol dimethacrylate; pentaerythritol tetramethyacrylate; 1,3-propane diol diacrylate; 1,6-hexane diol diacrylate; the bis-acrylates and methacrylates of polyethylene glycols of molecular weight 200–500; trimethylol propane triacrylate; 2-ethyl-2-(hydroxylmethyl)-1,3propanediol triacrylate; pentaerythritol triacrylate; unsaturated amides such as those of the methylene carboxylic acids and especially those of alpha, omega-diamines and oxygen-interrupted omega-diamines such as methylene bisacryl and bismethacrylamide; diethylene triamine tris-methacrylamide; bis-(methacrylamidopropoxy) ethane; bis-methacrylamidoethyl methacrylate; N-[ (B-hyroxyethyloxy) ethyl] acrylamide; vinyl-esters such as divinyl succinate; divinyl adipate; divinyl phthalate, divinyl terephthalate, divinyl benzene-1,3-disulfonate,and divinyl butane-1,4-disulfonate; and unsaturated aldehydes such as sorbaldehyde.

The composition will typically contain about 1% to about 10% and preferably about 2% to about 8% by weight of the reactive diluent based upon the weight of copolyamic acid or derivative thereof.

When compositions of the present invention are to be used in forming a pattern, the exposure to the actinic radiation is imagewise exposure of selected portions using contact or projection techniques. The unexposed portions are then removed such as by dissolution in a developer such as N-methylpyrrolidinone, butyrolactone, diglyme, mixtures of N-methylpyrrolidinone and diglyme and mixtures of N-methylpyrrolidinone and xylene. When the actinic radiation is ultraviolet light or x-rays, a mask is employed to define the pattern. On the other hand, when the actinic radiation is e-beam, direct pattern writing is used without employing a mask.

The developing normally takes about 3 to about 6 minutes and preferably about 3 to about 4 minutes.

In addition, polymers of the present invention can be used as low loss optical waveguides and in compression molding operations. Polymers of the present invention also exhibit elongation properties (e.g.—25%) above the Tg.

The following non-limiting examples are presented to further illustrate the present invention:

EXAMPLE 1

A 3 neck flask is flame dried, evacuated and placed under a nitrogen atmosphere. To this flask are added with stirring about 15 grams (0.051 moles) of 3,3'4,4'biphenyl tetracarboxylic acid (BPDA) dianhydride to 100 ml of N-methyl pyrrolidinone to produce a dianhydride suspension.

In a separate flask about 4.96 grams (0.0459 mole) of phenylenediamine (PDA) and about 1.7 grams (0.0051 moles) of 2,2-bis (4-aminophenyl) hexafluoropropane are added to about 100 ml of N-methyl-pyrrolidinone at a temperature of about 50° C. to produce a diamine solution.

The diamine solution is then added to the suspension of the dianhydride.

The mixture is reacted under nitrogen for about 12 hours. The polymer obtained exhibits the properties reported below in Table 1.

EXAMPLE 2

Example 1 is repeated except that the molar ratio of the PDA to fluorinated diamine is 4:1. The results are reported in Table 1 below.

EXAMPLE 3

Example 1 is repeated except that the molar ratio of the PDA to fluorinated diamine is 7:3. The results are repeated in Table 1 below.

EXAMPLE 4

Example 1 is repeated except that the molar ratio of the PDA to fluorinated diamine is 1:1. The results obtained are reported in Table 1 below.

COMPARISON EXAMPLE 5

Example 1 is repeated except that no fluorinated diamine is employed. The results obtained are reported in Table 1 below.

TABLE 1

| Example No. | Absorption at 365 nm | Glass Transition temperature (Tg) | Thermal Expansion Coefficient (TCE) |
| --- | --- | --- | --- |
| 1 | 0.60 | >400 | 17 |
| 2 | 0.48 | 389 | 29 |
| 3 | 0.28 | 370 | 34 |
| 4 | 0.22 | — | — |
| 5 | 1.16 | >400 | 5 |

As evident from the above results, even a 10 molar % of the fluorinated diamine reduces the absorption by a half at 365 nm, the glass transition temperature for the materials of the present invention are not significantly lowered, nor is the TCE significantly increased. The polymers having 20 and 30 molar % of the fluorinated diamine also have acceptable TCE values and Tg.

The polymers of the present invention when heated above the Tg can be extended by at least about 25%; while the polymers without the fluorinated diamine undergo very little extension (0.8%). The extendability of the polymers of the present invention suggest that such would be suitable for compression molding.

EXAMPLE 6

A 3 neck flask is flame dried, evacuated and placed under a nitrogen atmosphere. To this flask are added with stirring about 6.8 grams (0.023 moles) of BPDA and 10.3 (0.023 moles) of 2,2 bis(3,4dicarboxyphenyl)hexafluoropropane dianhydride to about 100 ml of N-methyl-pyrrolidinone to produce a dianhydride suspension. In a separate flask, about 5 grams (0.046 moles) of PDA is added to about 100 ml of N-methylpyrrolidinone at a temperature of about 50° C. to produce a diamine solution. The diamine solution is added to the dianhydride suspension. The mixture is reacted under nitrogen for about 12 hours. The results are similar to those of Example 4.

EXAMPLE 7

A three-necked flask is dried, and placed under an atmosphere of dry air. To this flask are added about 239.8 grams (0.815 moles) of BPDA, about 224.1 grams (1.722 moles) of 2-hydroxyethylmethacrylate, about 0.40 grams benzoquinone, about 34.86 grams (0.00353 mole) triethylamine and about 800 ml chloroform. This mixture is stirred and refluxed overnight to produce the diethylmethacrylate ester-diacid derivatives of BPDA. The chloroform is removed under reduced pressure and the resulting oil is triturated with hexane to remove excess hydroxyethylmethacrylate. The diester-diacid is dissolved in about 800 ml ethylacetate and about 0.4 grams benzoquinone is added. This solution is cooled in an ice bath to about 5° C. and about 393.2 grams (3.098 moles) of oxalyl chloride is added slowly keeping the temperature below 10° C. The reaction is allowed to proceed at room temperature overnight and then warmed to about 45° C. for about 1 hour to complete the preparation of the diester-diacyl chloride derivatives of BPDA. Excess oxalyl chloride is removed under reduced pressure, triethylamine hydrochloride is removed by filtration and the diester-diacyl chloride is added slowly to a solution of about 76.96 grams (0.712 moles) of p-phenylenediamine (PDA) and about 26.43 grams (0.0791 moles) of 2,2-bis(4-aminophenyl)hexafluoropropane in about 254.1 grams (3.212 moles) pyridine and about 2 l of N-methylpyrrolidinone at a temperature of about 5° C. The resulting polyamic ester can be isolated by precipitation in water and the yield is about 450 grams.

EXAMPLE 8

A composition containing about 35% by weight of the copolymer prepared along the lines of Example 1 in N-methyl-2-pyrrolidinone, about 3% by weight of Ciba-Geigy CG 25-369; about 3% by weight of propoxythioxanthone sensitizer, and about 7.5% of 2-ethyl-2-(hydroxymethyl)1,3propane diol triacrylate diluent is coated onto a substrate by spinning. The composition is post-apply baked at about 80° C. for about 4 minutes on a hotplate to provide a coating of about 17 μm thick. The coating is then exposed to 404 nanometer with a dose of about 400 millijoules. The coating is then post-expose baked at about 80° C. for about 2 minutes on a hotplate and dip developed using a composition of about 90% diglyme and 10% N-methyl-2-pyrrolidinone for about 3 minutes followed by a methyl ethyl ketone rinse. Four μm lines are resolved in the 17 μm thick film. The figure is a SEM illustrating the resolution of this example. The coating is post-cured to about 400° C. to provide a 7.5 μm thick film.

What is claimed is:

1. A copolyamic acid from
   a) tetracarboxylic acid dianhydride,
   b) organic diamine having the formula:
      $H_2N\ R^1\ NH_2$; wherein $R^1$ is a polycyclic aromatic organic diradical selected from the group consisting of aromatic, heterocyclic, and directly attached rings; and
   (c) a co-reactant selected from the group consisting of:
      (1) fluorinated diamine having a formula selected from the group consisting of:

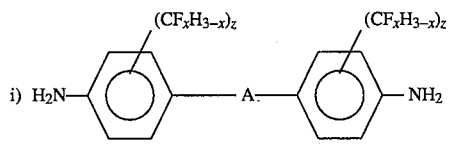

wherein A is $C(CF_xH_{3-x})\ (R^2)$ $R^2$ selected from the group consisting of alkyl containing 1–6 carbon atoms, aryl containing 6 carbon atoms and $CF_xH_{3-x}$;

x is a whole number integer from 1–3 z is a whole number integer from 0–4; and

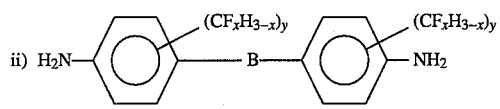

wherein B is a direct bond or $C(CH_3)_2$; and y is a whole number integer from 1–4; (2) fluorinated tetracarboxylic acid dianhydride having the formula

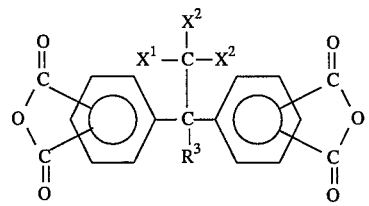

wherein $X^1$ is fluorine and each $X^2$ individually is selected from the group consisting of hydrogen, fluorine and chlorine; $R^3$ is selected from the group consisting of alkyl containing 1–6 carbon atoms, aryl containing 6 carbon atoms and $C(X^2)_3$; and (3) mixtures of (1) and (2);

and when said co-reactant includes said fluorinated diamine, the molar ratio of said organic diamine to said fluorinated diamine is about 9.5:1 to about 7:3; and when said co-reactant includes said fluorinated tetracarboxylic acid dianhydride, the molar ratio of said tetracarboxylic acid dianhydride to said fluorinated tetracarboxylic acid dianhydride is about 9.5:0.5 to about 7:3.

2. The copolyamic acid of claim 1 wherein said tetracarboxylic acid dianhydride is 3,3',4,4' biphenyl tetracarboxylic acid dianhydride.

3. The copolyamic acid of claim 2 wherein said diamine is p-phenylene diamine.

4. The copolyamic acid of claim 1 wherein said tetracarboxylic acid dianhydride is terphenyl dianhydride.

5. The copolyamic acid of claim 1 wherein the molar ratio of the organic diamine to the fluorinated diamine is about 9:1 to about 8:2.

6. The copolyamic acid of claim 1 wherein the molar ratio of the tetracarboxylic acid dianhydride to the fluorinated tetracarboxylic acid dianhydride is about 9:1 to about 8:2.

7. The copolyamic acid of claim 5 wherein said fluorinated diamine is 2,2-bis[4-aminophenyl] hexafluoropropane.

8. The copolyamic acid of claim 1 wherein said fluorinated diamine is 2,2-bis[4-aminophenyl] hexafluoropropane.

9. A copolyamic ester of the copolyamic acid of claim 1.

10. The copolyamic ester of claim 9 wherein said ester is monoethylenically or monoacetylenically unsaturated carboxylic ester.

11. The copolyamic amine salt of the copolyamic acid of claim 1.

12. The copolyamic acid of claim 1 wherein said fluorinated tetracarboxylic acid dianhydride is 2,2 bis(3,4-dicarboxyphenyl) hexafluoropropane.

13. A copolyimide from curing the polyamic acid of claim 1 or an ester or amine thereof.

14. The copolyamic ester of claim 10 being obtained by reacting the copolyamic acid with a member selected from the group consisting of dimethylaminomethylmethacrylate, aminostyrene, hydroxyethylmethacrylate, hydroxypropylmethacrylate, hydroxyethylacrylate, N-(hydroxymethyl) acrylamide and propargyl alcohol, and mixtures thereof.

15. The copolyamic amine salt of claim 11 being obtained by reacting the copolyamic acid with a member selected from the group consisting of 3-allylamines, propargyl amines, aromatic amines, and mixtures thereof.

16. The copolyamic amine salt of claim 15 wherein said aromatic amine is selected from the group consisting of dimethylaminomethylmethacrylate, aminostyrene, and mixtures thereof.

17. The copolyamic acid of claim 1 wherein said tetracarboxylic acid dianhydride is selected from the group consisting of pyromellitic dianhydride; 2,3,6,7-naphthalene tetracarboxylic dianhydride; 3,3',4,4'-biphenyltetracarboxylic acid dianhydride; 1,2,5,6-naphthalene tetracarboxylic dianhydride; 2,2',3,3'-biphenyl tetracarboxylic dianhydride; bis (3,4-dicarboxyphenyl) sulfone dianhydride; 3,4,3',4'-benzophenone tetracarboxylic dianhydride; terphenyl dianhydride; and mixtures thereof.

18. The copolyamic acid of claim 1 wherein said organic diamine is selected from the group consisting of p-phenylene diamine; 4,4'-diamino-diphenylamine; benzidine; 4,4'-diamino-diphenyl ether; 1,5-diaminonaphthalene; 3,3'-dimethyl-4,4'-diamino-biphenyl; 3,3'-dimethoxy benzidine; 1,4-bis(p-aminophenoxy) benzene; 1,3-bis(p-aminophenoxy) benzene; and mixtures thereof.

19. The copolyamic acid of claim 1 wherein A is $C(CF_3)_2(phenyl)$.

20. The copolyamic acid of claim 1 wherein B is a direct bond or $C(CH_3)_2$.

21. The copolyamic acid of claim 1 which has a Tg of at least about 320° C. in the absence of said co-reactant (c).

22. The copolyamic acid of claim 21 wherein said Tg is at least about 350° C.

* * * * *